US 6,554,697 B1

(12) United States Patent
Koplin

(10) Patent No.: US 6,554,697 B1
(45) Date of Patent: Apr. 29, 2003

(54) COMPUTER CABINET DESIGN

(75) Inventor: Edward C. Koplin, Baltimore, MD (US)

(73) Assignee: Engineering Equipment and Services, Inc., Timonium, MD (US)

(*) Notice: Subject to any disclaimer, the term of this patent is extended or adjusted under 35 U.S.C. 154(b) by 0 days.

(21) Appl. No.: 09/453,799

(22) Filed: Dec. 3, 1999

Related U.S. Application Data

(63) Continuation-in-part of application No. 09/223,002, filed on Dec. 30, 1998.

(51) Int. Cl.[7] .............................................. H05K 5/00
(52) U.S. Cl. ...................................... 454/184; 361/690
(58) Field of Search ................................ 454/184, 334; 361/690, 692, 695, 678

(56) References Cited

U.S. PATENT DOCUMENTS

| | | | | |
|---|---|---|---|---|
| 1,111,805 A | * | 9/1914 | Pykett | 454/334 X |
| 3,348,609 A | | 10/1967 | Dubin et al. | 165/47 |
| 3,714,793 A | | 2/1973 | Eigenbrod | 62/62 |
| 3,756,218 A | | 9/1973 | Simpson | 126/540 |
| 3,903,404 A | * | 9/1975 | Beall et al. | |
| 3,942,426 A | | 3/1976 | Binks et al. | 99/473 |
| 4,016,357 A | | 4/1977 | Abrahamsen | 174/48 |
| 4,275,538 A | | 6/1981 | Bounds | 52/299 |
| 4,458,296 A | | 7/1984 | Bryant et al. | 361/691 |
| 4,513,351 A | | 4/1985 | Davis et al. | 361/384 |
| 4,767,262 A | * | 8/1988 | Simon | 415/119 |
| 4,774,631 A | * | 9/1988 | Okuyama et al. | |
| 4,845,380 A | * | 7/1989 | Piegari | 307/149 |
| 4,874,127 A | * | 10/1989 | Collier | |
| 5,150,277 A | * | 9/1992 | Bainbridge et al. | 361/384 |
| 5,297,004 A | * | 3/1994 | Mazura | 361/690 |
| 5,335,144 A | * | 8/1994 | Maroushek | 361/695 |
| 5,345,779 A | * | 9/1994 | Feeney | |
| 5,398,666 A | | 3/1995 | Smith et al. | 126/21 A |
| 5,431,490 A | | 7/1995 | Edwards | 312/116 |
| 5,467,250 A | * | 11/1995 | Howard et al. | 454/184 |
| 5,508,890 A | * | 4/1996 | Hirata | 361/829 |
| 5,544,012 A | * | 8/1996 | Koike | 361/695 |
| 5,684,674 A | * | 11/1997 | Yin | 361/695 |
| 5,718,628 A | * | 2/1998 | Nakazato et al. | 454/184 |
| 5,729,996 A | | 3/1998 | Barger | 62/288 |
| 5,766,453 A | | 6/1998 | Morellato et al. | 210/143 |
| 5,782,546 A | * | 7/1998 | Iwatare | 312/236 |
| 5,800,258 A | * | 9/1998 | Knoop et al. | 454/184 |
| 5,845,631 A | | 12/1998 | Kleva et al. | 126/21 A |

* cited by examiner

Primary Examiner—Harold Joyce
Assistant Examiner—Derek S. Boles
(74) Attorney, Agent, or Firm—Lieberman & Brandsdorfer, LLC

(57) ABSTRACT

Cabinets or enclosures are provided having heat generating elements stored therein cooled by locating the cabinets on tiles of an elevated floor having cool air provided under the tiles, the cabinets having variable size openings in their bottom surface located over openings in the tiles, openings in the top surface of the cabinets, which openings may have fans located in the openings, highly perforated shelves and a highly perforated front door. By controlling the size of the various openings, and the number, if any, of fans and air flow through the door the temperature in the cabinet may be controlled. A number of cabinets may be located side-by-side with side walls in contact and with wires introduced into one cabinet from under the tiles through an opening in its bottom wall being passed from cabinet-to-cabinet through aligned openings in the side walls of the cabinets. The air flow within the cabinets may be reversed in air conditioned rooms not having cooling air under the floor on which the cabinet is situated.

27 Claims, 12 Drawing Sheets

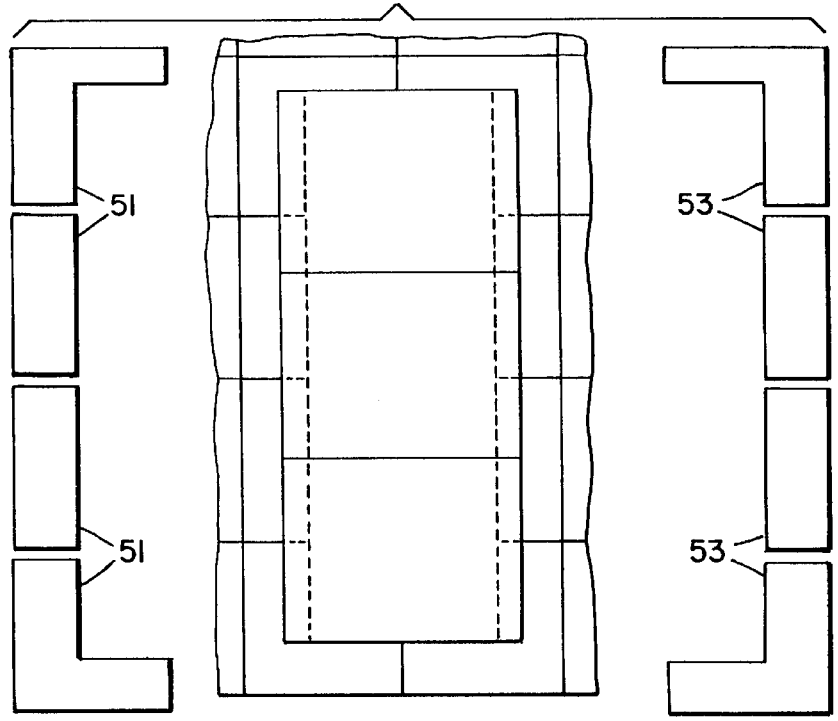
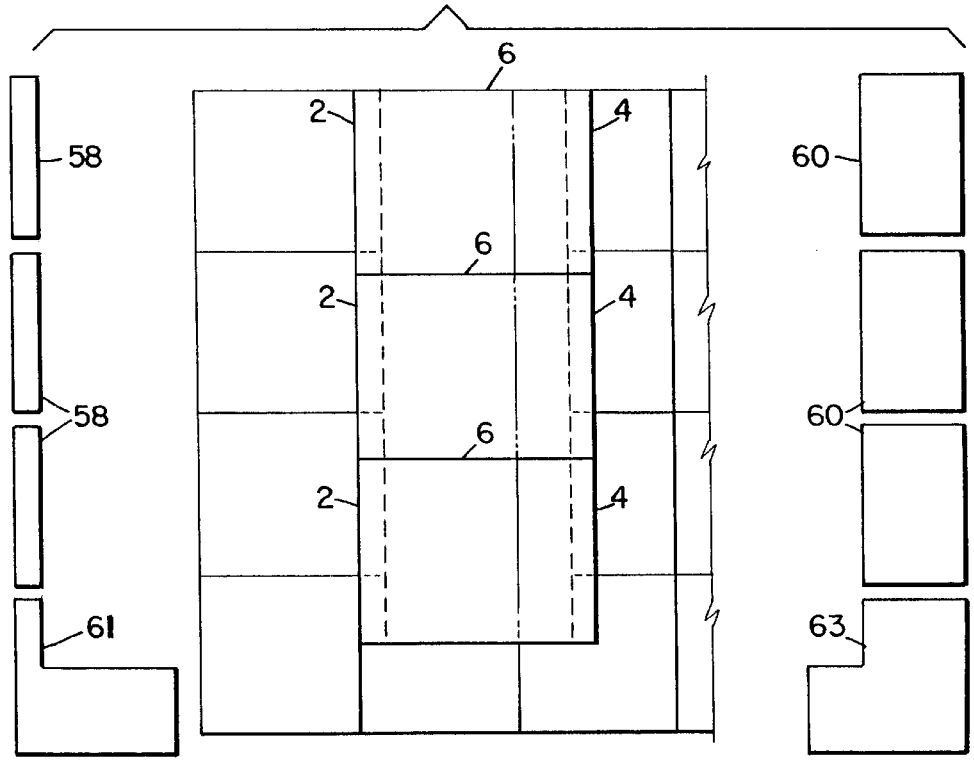

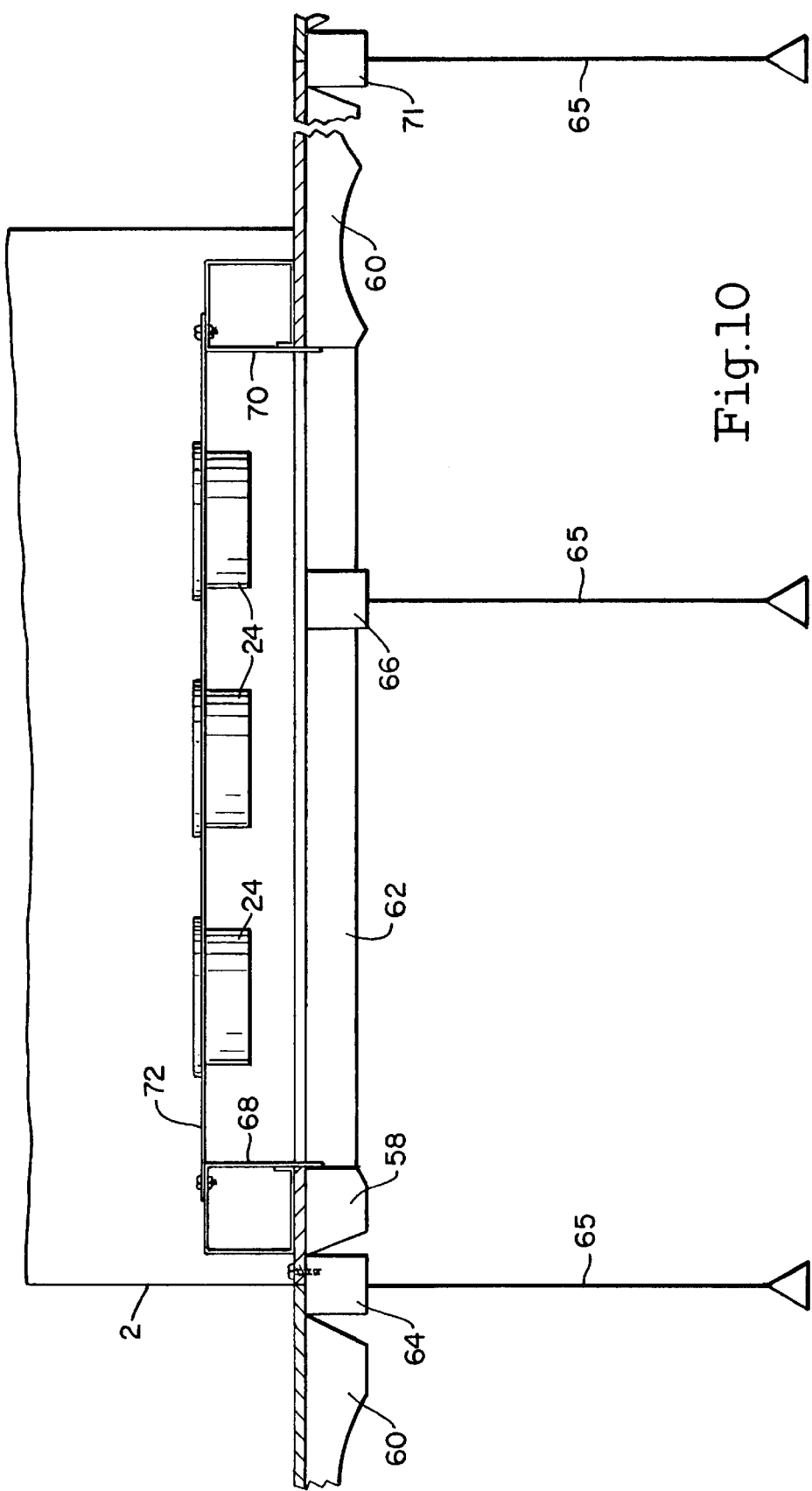

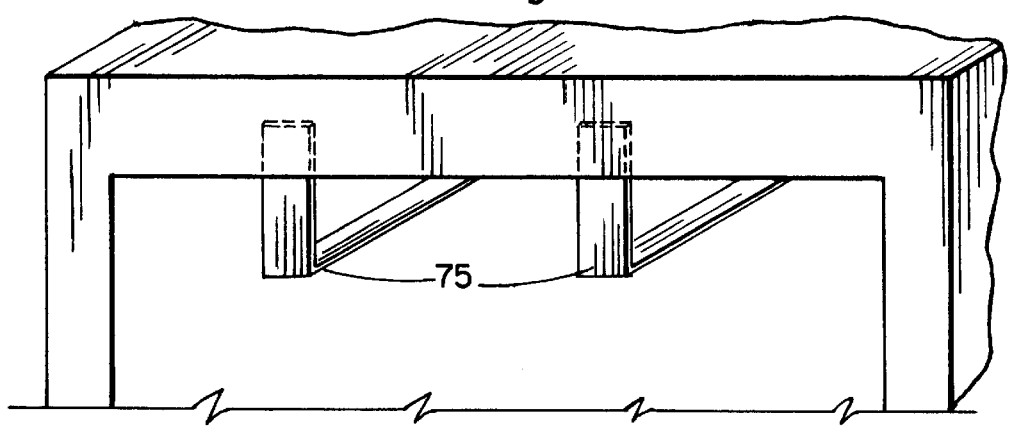
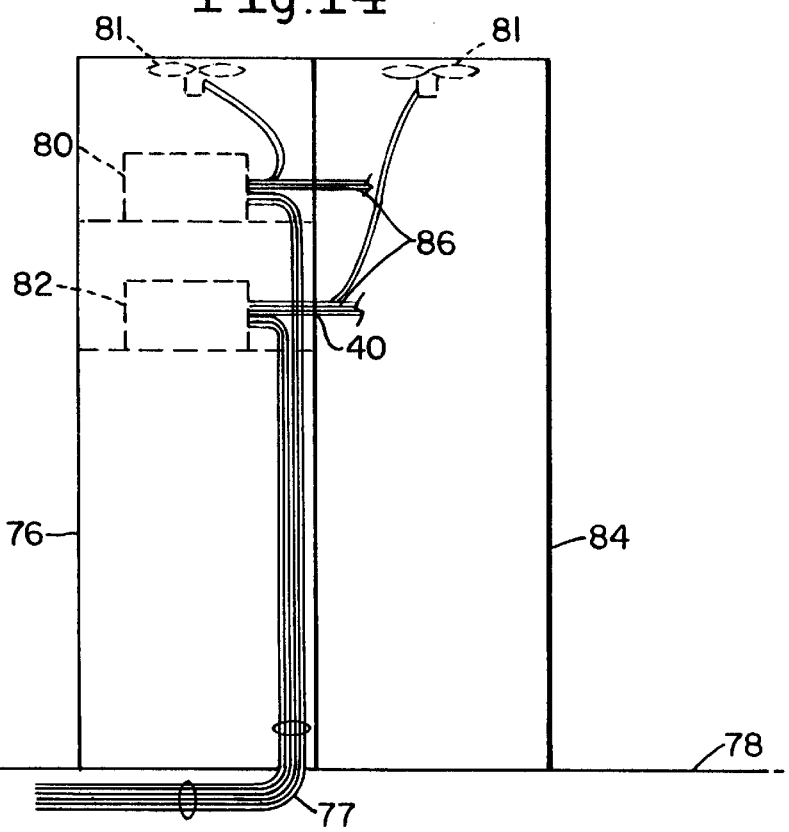

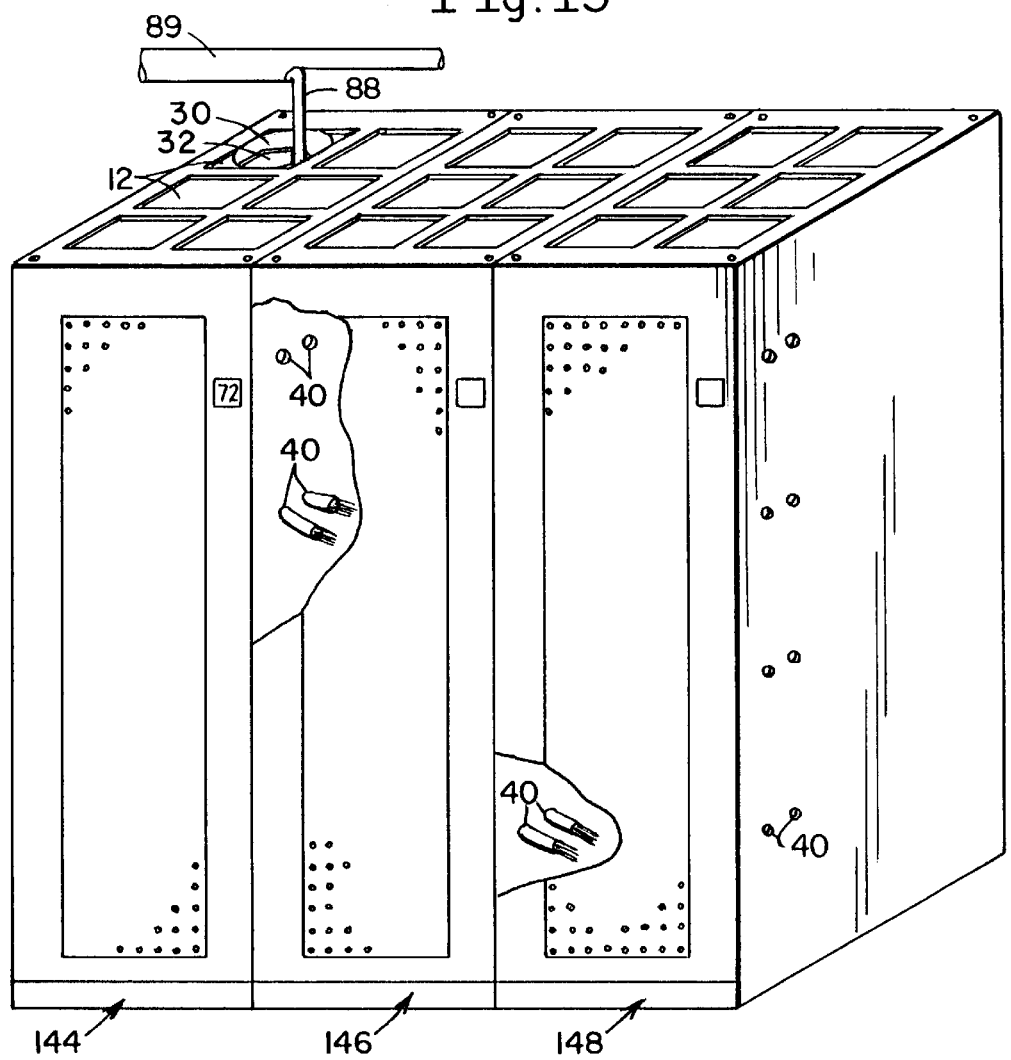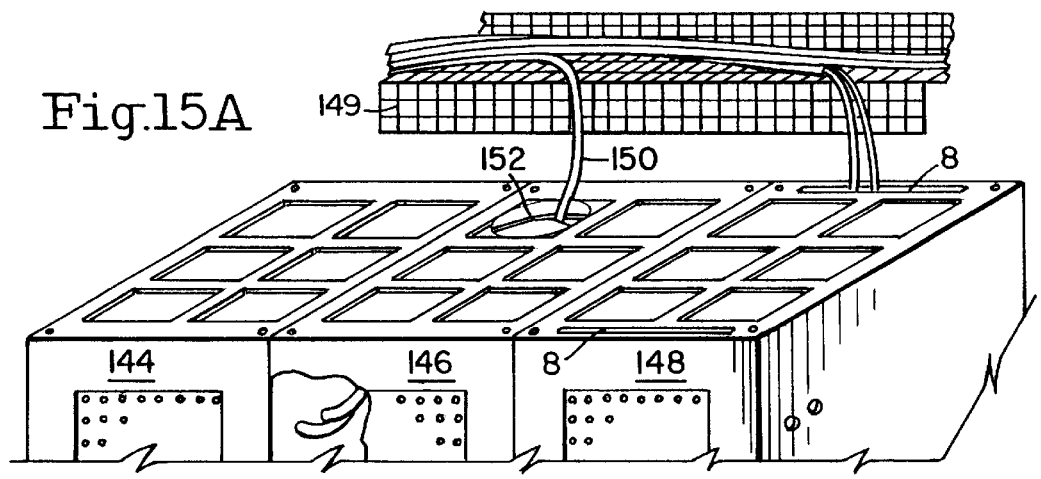

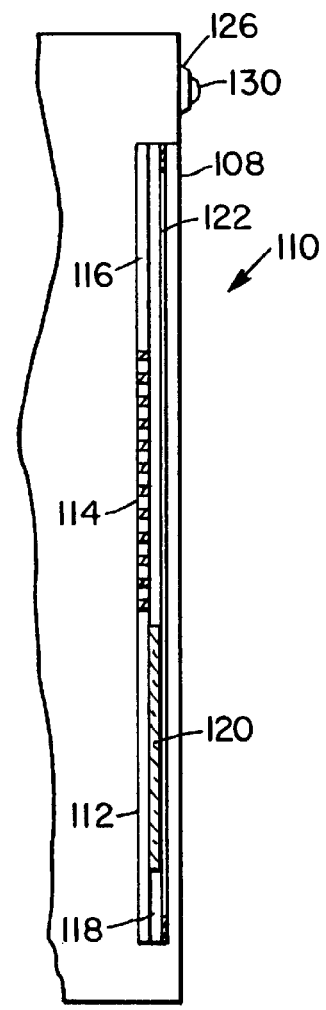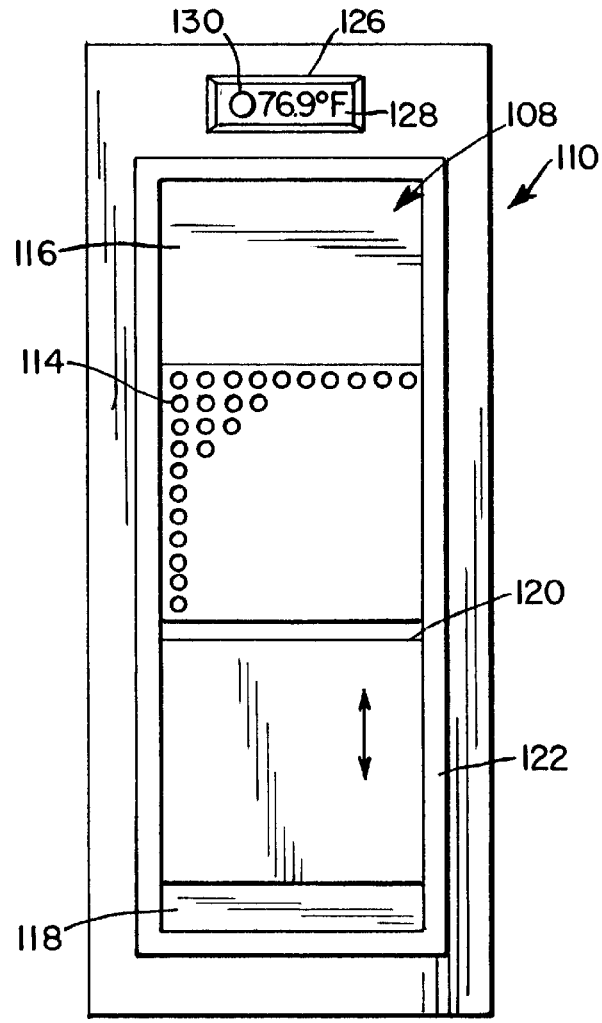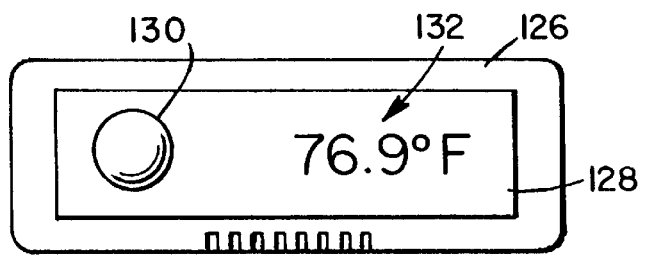

COMPUTER CABINET DESIGN

CROSS-REFERENCE TO RELATED APPLICATION

This application is a continuation-in-part of application Ser. No. 09/223,002 filed Dec. 30, 1998.

FIELD OF THE INVENTION

The present invention relates to cooling of equipment in cabinets and more particularly to integrate the cabinet cooling into a raised floor or overhead cooling system.

BACKGROUND OF THE INVENTION

It has been found that cabinet cooling systems that are not integrated with a fault tolerant, concurrently maintainable and transparently expandable design of a raised floor or overhead cooling system cannot reasonably control overheating of equipment. The heat produced in some of the higher technology systems exceeds the capacity of systems currently available resulting in damage to high-tech computers and peripheral equipment.

Often, expensive, quality uninterruptable power systems (UPS) are installed for both the computer systems and cabinet fan powered cooling assemblies. Existing cabinet cooling technologies, waste available UPS power because methods do not exist to vary the fan energy as a percentage of the power required to cool the critical computer and other electronic equipment installed in the cabinets. Additionally, the typical cabinet fan is non-redundant and is sized to cool the maximum load projected for the cabinet, even though the average cabinet may only contain a fraction of the heat producing equipment that was considered for the fan selection.

A major problem develops in those systems which are initially sufficient to handle the heat loads expected, but must have cooling capacity increased without disturbing the installed heat producing equipment. There are many industries that cannot readily accept down time of equipment to accommodate changes; such as, railroads, production line control systems, financial markets, air travel reservation centers and the like.

Another problem is the industry practice to provide cuts in a raised floor that are left open with only a few square inches containing any cables or wires. Cooling air is drained from the raised floor unimpeded through the excessive cable openings, resulting in loss of air and static pressure that is needed for cooling elements or equipment in the cabinet overhead cooling is distributed from overhead ducts and the problem is that the room becomes cold, thus reducing the capacity of the cooling system.

In a large number of large installations, cabinets are set side-by-side with no walls in-between. The entire interior area thus created is treated in many respects as a single entity resulting in large amounts of fans used in the aggregate and wasted critical power. In these installations a fan or perhaps two are located in the top wall of the cabinets and may be programmed to a fixed speed. A cabinet with a large heat load may be positioned next to a cabinet with a small heat load and yet the fan associated with this later cabinet may be running at full speed. The usual procedure in such systems because there are separations between cabinets is to run with fans at a standard speed regardless of load which is very wasteful of critical power. It is to be noted that power is supplied for the computer and at most 10% should be used for cooling. Thus, every effort should be made to conserve power used for cooling.

The installations previously provided required the tiles of elevated floors to be cut at a cost of approximately $100/tile to accommodate the cabinets and provide adequate support. The cutting of the tiles, usually on the job, is time consuming and quite expensive. No attempt has been made to date to provide appropriate material to accommodate the floor to the cabinets or the cabinets to the floor.

Large losses of cooling energy are encountered through openings through which cables and wires are introduced into the cabinets. Inadequate use of masking or structural features to provide shielding is the rule.

An important failure of the prior systems is their failure to permit the system to be readily adjusted in the field to the environment. Openings cut in the field that were large enough for installers to work through, pull wires, etc. were grossly oversized for cooling. In many cases the cabinets were pre-wired and left unpowered, waiting months for operating load to materialize, yet the openings left by installers would not be closed. Any and all of the air passing through these access openings under the floor wasted cooling capacity and static pressure. They failed to a great extent to control properly cooling capacity, static pressure and to the extent controllable under very difficult procedures, often requiring a cabinet to be unloaded and tipped over for effecting control. The wasted cooling capacity issues could not be resolved even if other critical systems were adversely affected because the need for continuous data and telecommunications processing prevented any interruption to the operation of equipment in working cabinets. Retrofitting existing cabinets with on-line processing load is nearly impossible to accomplish without risk. Such latter procedure relates to the cooling capacity and pressure under tile floors and the need to insure, once installed, that each cabinet drain off minimum cooling air and produce minimum pressure drop.

OBJECTS OF THE INVENTION

It is an object of the present invention to avoid the necessity of custom cutting of floor tiles to accommodate equipment cabinets.

Another object of the invention is to employ barriers between cabinets to avoid interaction of cooling effects.

It is yet another object of the invention to provide equipment that permits convection cooling of components in a cabinet to reduce or eliminate the need for critical electrical power to operate cabinet cooling fans, or use forced cool air cooling or use of both types of cooling concurrently.

Yet another object of the invention is to provide members in the interior of a cabinet that prevent interference with the flow of cooling air from under the floor on which the cabinets are situated and members that prevent interface with flow into or out of the top of a cabinet.

It is still another object of the invention to permit cabinets having different power loads to be situated side-by-side without causing a cooling capacity conflict between adjacent cabinets.

An object of the invention is to control distribution of static pressure and cooling air from under the floor on which the cabinet is standing.

Another object of the invention is to be able to provide multiple installed fans where needed and to control the operation of the fans including disabling some or all to maintain a desired temperature.

Another object is to use fans that are small enough in size to allow multiple fans to fit on the top or the bottom of a standard sized cabinet for adequate capacity control, limiting the use of critical power yet still providing redundant fan operation.

Still another object of the invention is to provide visual and/or audible indications of the conditions in a cabinet.

Another object is to provide a network connection to monitor the cabinet cooling performance across a local area network (LAN), wide area network (WAN) or the Internet.

It is an object of the invention to prevent leakage of air to be used in cooling around cables bringing in power or control signals.

Still another object is to provide a method of field adjusting the wireway openings so that a cabinet can sit empty without wasting cooling airflow or static pressure, as the wireways remain closed while allowing easy field adjustments for wire and airflow once electronic equipment is installed into the cabinet.

Another object of the invention is to limit the use of critical power to that actually required to maintain temperature.

It is still another object of the invention to be able to accommodate vastly different cooling loads in adjacent cabinets.

Yet another object of the invention is to provide in the top of the cabinet accommodations for a plurality of panels that may accommodate fans, be blank panels, be panels for connection to forced air cooling supplies or large exhaust systems and highly perforated panels permitting ready air flow therethrough.

BRIEF DESCRIPTION OF THE PRESENT INVENTION

The cabinet of the present invention has a top surface that can accommodate multiple insertable panels that may be blank plates, highly perforated laces, variable opening grommets, pipes to accept cooling, or exhaust air and/or fans. Multiple induction fans may be used and allow paralleling of the capacity incrementally to provide redundant fan operation as needed, while limiting UPS power. The bottom surface of the cabinet sits on tiles of a raised floor in one embodiment over an opening and has multiple adjustable grommets to control flow of cool air into the cabinet as needed. The shelves in the cabinet are all highly perforated, while simultaneously fabricated for adequate structural support, so that cool or ambient air may readily flow through the cabinet and out of the top. The door and perhaps back panel of the cabinet may also have controlled perforated regions. A highly perforated shelf installed at the factory is positioned a distance above the floor to prevent any equipment to be placed under the shelf so that flow through the grommets is not impeded. Cooling can also be provided by overhead ducts, but with the degree of cooling required for cabinets containing equipment that creates high temperatures, the room itself would be far too cool for comfort. A solution to the use of overhead ducts for cooling is to direct the cool air through small distribution ducts directly into the cabinets.

The cooling mechanism employed does not rely heavily on the pressurized air from under the floor. The mechanism relies in most instances on room air drawn into the cabinet by convection and/or a fan or fans located on the top of the cabinet. The cabinet resembles a stack with both convection currents and the fan inducing the air heated by the equipment to flow out of the top of the cabinet. In many instances the convection currents are sufficient to cool the equipment and the fan are used to break up conflicting convection flow patterns. The fan insures that the air flows around all of the equipment to carry off the heat. This feature is assisted by highly perforated shelves. If necessary, cooling air from under the floor may be admitted to the cabinet through grommets in the bottom of the cabinet controlling such flow. The flow of pressurized cool air into the cabinet is limited to that necessary to affect the desired cooling so as not to overload and possibly burn up the air conditioners supplying cool air under the floor.

The stack effect of the cabinets causes the heated air to rise well above the cabinets so that hot air exiting one cabinet does not flow around the air intake region of adjacent cabinets.

A slide damper in the door is held in an open, partially open, or closed position by nylon or other plastic non-electrically conductive hardware so that if screws, fasteners, plugs, etc. break loose as a result of vibration or use of the damper electrical equipment is not damaged. Also, the damper is fail safe; that is, if the screws, plugs, etc. holding the damper in a fully closed or partially open position, the damper fully opens and the equipment will not overheat. Further, the hardware employed is captive hardware such that only broken parts can fall in the cabinet. Under normal circumstances there are no loose parts. All components of the physical system are available from outside the cabinet so that tools are not required to be introduced into the cabinet eliminating the danger of damage to the equipment terminals or wires from the tools. The cabinet may be modified by adding or subtracting fans in the top of the cabinet, inserting or removing panels in the door or adjusting the slide damper in the door, all done externally of the cabinet equipment hardware shelves.

The panels in the front of the cabinet can be manufactured in a clear plexiglass so that lights and other status indicators on the computers are visible through the perforations and the clear blocking panel behind.

It is preferred that all six openings have fans installed at the factory and that temperature responsive controls be employed to control the speed of the fans. Such an arrangement provides maximum flexibility together with the ability to handle maximum as well as minimum heat loads. If for any reason a customer does not desire such an arrangement then a blank panel or panels can be inserted into the unused opening in the top wall to prevent flow of heated air in the room from flowing into the cabinets. As pointed out elsewhere if sufficient flow is induced in the cabinet then a perforated panel can be employed in one of the slots. The type of flow can be induced by convection cooling, then a perforated panel may be used alone or in conjunction with fans carefully adjusted. Cool air can be added from the floor to increase upward flow if the heat is such that the cool air can be heated sufficiently by the equipment to add to the induced flow from outside or is pulled up by fans on the top of the cabinet.

A temperature control and alarm system suitable for use in such a system is sold by Weiss Industries, Farmingdale, N.Y. One such system employs thermistors for sensing temperature network interface circuit, and includes a temperature display. Using this system allows for all of the fans to be factory installed and their speed controlled to maintain temperature.

A manually operated system may also be employed. Initially, all fans are adjusted to desired cabinet operating temperatures and after a short period of time are readjusted to achieve desired results. The temperatures in the cabinets are relatively stable and the display discussed above will warn of any changes needing correction, which will be infrequently.

The use of a structure that permits adjustment of the air flow insures that no more cool air is drawn through the cabinet then is necessary to produce the required cooling. If the heat load is very light no fans may be necessary, and all available openings, as will become apparent, remain in the form of perforated panels and air is in effect pumped through the cabinet by convention currents produced by the heat of the loads inside the cabinet. No opening to the cool air under the floor may be necessary. In prior art systems, as stated above, the electrically powered equipment in the cabinet is fed from an uninterruptable power source (UPS), backed up with direct current batteries. These UPS systems are very expensive and power consumption is carefully scheduled. It is an advantage of the present invention to have a convection cooling mode for the cabinet that does not require any UPS power. If the cooling load is greater, one fan may be employed, (an additional fan provides "N+1" redundant operation), together with the grommets adjusted to provide sufficient cooling air flow capacity from below the raised floor. In this manner the cooling requirement is satisfied while simultaneously using a minimum of power, raised floor cooling air flow and static pressure. If redundancy is required, for fault tolerance, an additional fan can be used simultaneously to serve a load. The fans have been sized to allow parallel operation of multiple fans. Solid side panels with grommeted holes for wires extending between adjacent cabinets prevent cooling air from short cycling from a heavily loaded cabinet that is adjacent to a lightly loaded cabinet that is adjacent to a lightly loaded, or empty cabinet. If the heat load is heavy fans may be added and the grommets may be opened further. In consequence of such an arrangement heat loads from 100 watts per cabinet up to over 6000 per cabinet may be accommodated.

An additional control is provided by a highly perforated front door of the cabinet. Air is drawn through the front door which is adapted to receive blank panels, so as to block air flow through various regions of the door whereby to control ambient air mixing with the cooling air. If fans are not used, the panels may not need to be inserted, although in some instances leaving part of the perforated opening obstructed may aid convention cooling. Research has proven that having the entire panel unobstructed hurts convection.

The ability to control the cooling effect as a function of heat load by adding or subtracting fans, varying the speed of the fans, controlling the grommets, and controlling flow through the front door without having to make any interior adjustments or changing basic structure provides a degree of flexibility not previously achievable. Concurrent maintainability is critical to the operators of these mission critical facilities.

Additional features of the system relate to the ability to make the changes with ease (concurrent maintainability). A preferably factory installed bottom shelf of the cabinet is located above the floor a distance that permits ready access to the grommets for adjustments to airflow or wire installations. Air flow blocking solid panels fit into spaces into the top that can otherwise receive panels having fans mounted thereon. Clearance bars residing just under the top of the cabinet prevent equipment from being inserted so close to the fans as to inhibit air flow. Additional adjustment is provided by the highly perforated front door and back panel, if convenient, of the cabinet. With a stand alone cabinet, the side panels may be perforated. Various tiles of the elevated access floor must be left out of the floor installation, saving floor costs and construction time so as to provide unimpeded access of the cabinet to the cooled air and wiring below the elevated floor. In addition, special fixtures are provided to prevent parts of the smaller floor panels from sliding under its associated cabinet, thereby impeding flow into the cabinet.

The above and other features insure that cooling under the floor is employed only when needed and only to the extent necessary to maintain the equipment in the cabinet within the desired temperature range for each piece of equipment. Thus, the desired objective to insure that cooling air and static pressure under the raised floor environment is not wasted by large cuts in the floor to access cables and provide enough space for a mechanic to work. Alternatively, when air is provided from overhead, the induction fans are used to efficiently cool the equipment without sub-cooling the front.

Another distinct advantage of the adjustable grommets is to provide room for a workman to install cables and conduits in the cabinet through the floor and then employ a rotating lid of the grommet for restricting airflow once the cables are installed. A snap in lid to prevent loss can be used, but can easily be removed if necessary for installation and repair work. If additional cooling is required, the grommets can be adjusted without having to move the cabinet.

There are installations in which the site is kept quite cool by air conditioning of the room and under floor cooling is not employed. In such an event the structure is raised above the floor and the access flooring is only used for power and network cabling, not cooling. Under these circumstances it is a violation of National Electric and National Fire Protection Codes to use the access floor for air distribution. The cabinet advantage here is that the induction fans on the top of the cabinet are used to draw room air in from the front, side or back perforated panels. Room air conditioning is used to supplement the ambient cooling effect of the air induced through the cabinet perforated panels. The grommets in the bottom plate remain closed except for those used for power or network cables. Once the wiring and cabling is installed, the grommets are closed down around the cables and wires to avoid wasting airflow from the induction fans and preventing a serious life-safety code violation by inducing airflow through the non-plenum rated access floor. A combination of induction induced flow and fan induced flow may be employed with one or both induced flows employed.

In other installations, the cabinet sits directly on the floor and the power and network cabling is run in cable trays overhead.

The enclosed cabinet concept has distinct advantages in these areas as one of the fan modules can be replaced with a grommet to allow overhead wiring to be routed down into the cabinet top and the grommet rotated to avoid the loss of airflow, while the remaining fan modules remain intact for cooling. If it is preferred to keep all fans in place, the wires can be brought into a fastened slot on the top of the cabinet, next to the fans. Again, room air, supplemented with room air conditioning units, provides the cooling as the room air is induced through the perforated panels of the cabinet. The cables and wiring may now be brought in through the top through a grommet or through a side wall. Convection cooling assists the cooling process; that is, it acts as a pump for moving cool air upward. Room air conditioning supplements the air in the room which is then drawn into the cabinet through the perforated front, side or back walls and directed to the computer equipment of the cabinet.

The concept of bringing in the cables etc. through the top wall may also be applied to the structure employing under floor cooling. One of the panels in the top wall may be replaced with a grommet to provide this feature.

In still another embodiment where under floor air is not employed for cooling but room air conditioning is. The cabinet sits above the floor and fans are inserted in the bottom as well as the top of the cabinet. Since the colder air always falls toward the floor, fans in the bottom of the cabinet blowing upward produce the greatest efficiency in the system.

If the room is air conditioned, take offs from overhead ducts can blow down directly into the cabinets while the fans in both the top and bottom of the cabinets draw air down through the cabinet; the fan on top being removed from the area of the incoming duct as far as the top of the cabinet permits.

Other features, objects and advantages of the present invention, together with the best means contemplated by the inventor thereof for carrying out the invention will become more apparent from reading the following description of a preferred embodiment and perusing the associated drawing in which:

BRIEF DESCRIPTION OF THE DRAWINGS

FIGS. 9, 9A–9B illustrates the arrangement of the cabinet on the floor tiles and the modification of the tiles to provide access for the cabinet to the cold air under the tiles;

FIG. 10 is a front view in elevation of the placement of a cabinet over an open area of the access flooring installation providing access of the interior of the cabinet to the pressurized cold air;

FIG. 13 illustrates the use of clearance bars to prevent blockage of the air flow through the top of the cabinet;

FIG. 14 illustrates the entry of wires and cables into one cabinet and the passage of wires and solid cables into an adjacent cabinet through the solid side wall panels with grommeted holes for the wires;

FIG. 15 illustrates an arrangement in which several cabinets are located side-by-side and cabling is brought into each cabinet from an overhead cable tray through grommets in the top wall that replace the panels illustrated in FIG. 1. One of the panels 12 of FIG. 1 is replaced by a grommet and wires and cables are or may be brought into the cabinet through that grommet in the top wall;

FIG. 15A is a detailed view of the top of the cabinets of FIG. 15;

FIG. 17 illustrates a slide for controlling air flow through the door;

FIG. 18 illustrates the overheat alarm;

FIG. 18A illustrates the overheat alarm in detail; and

DETAILED DESCRIPTION OF THE PRESENT INVENTION

Figure 1:
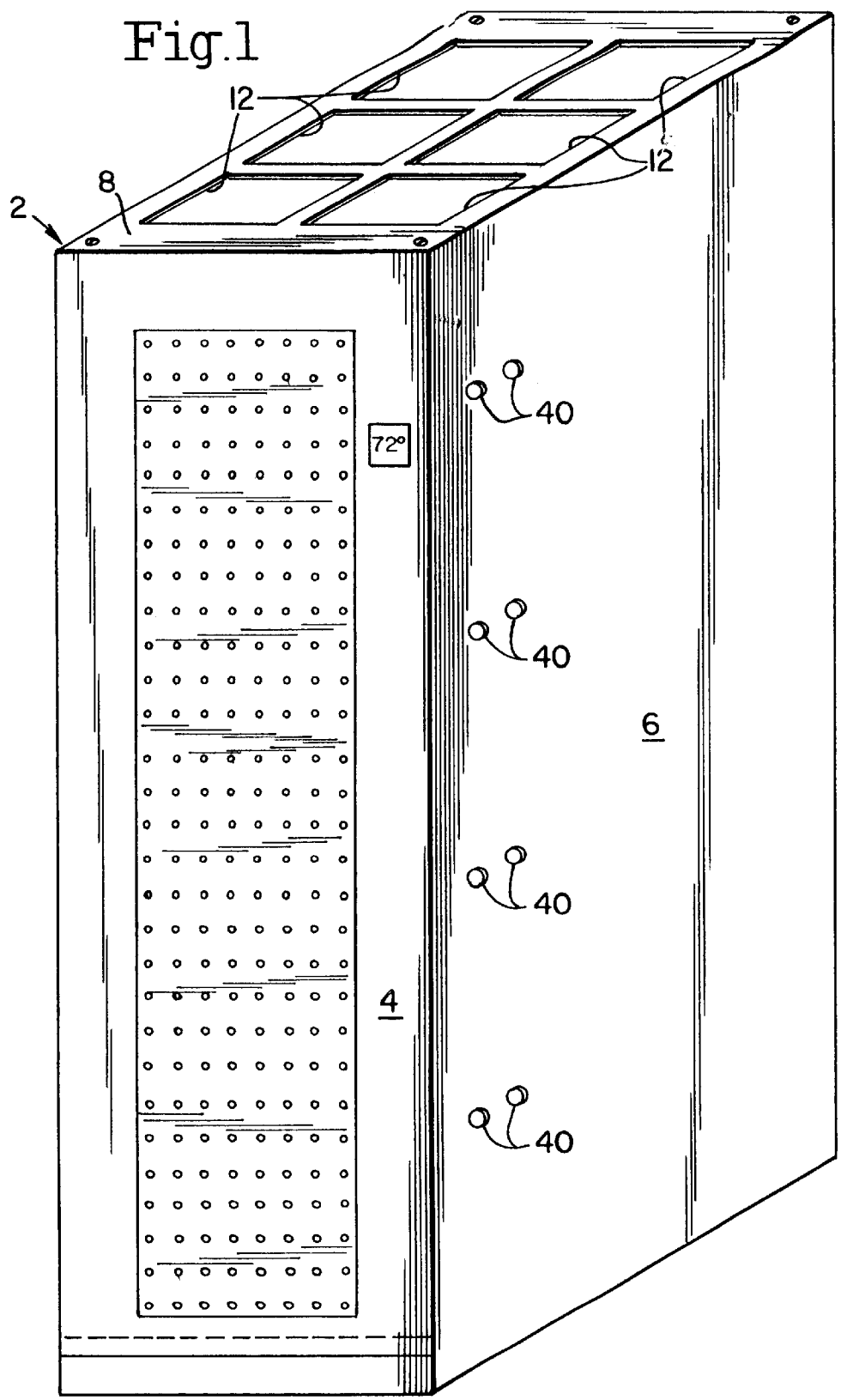
FIG. 1 is an isometric view of a cabinet according to the present invention.
Figure 2:
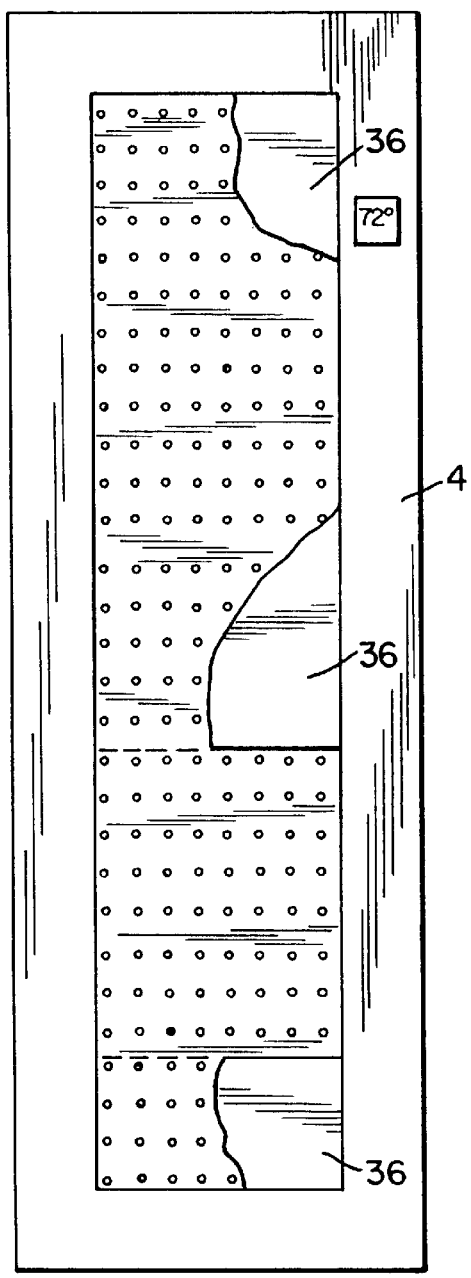
FIG. 2 is a front view of the cabinet with blank panels installed behind the perforated front door of the cabinet.
Figure 5:
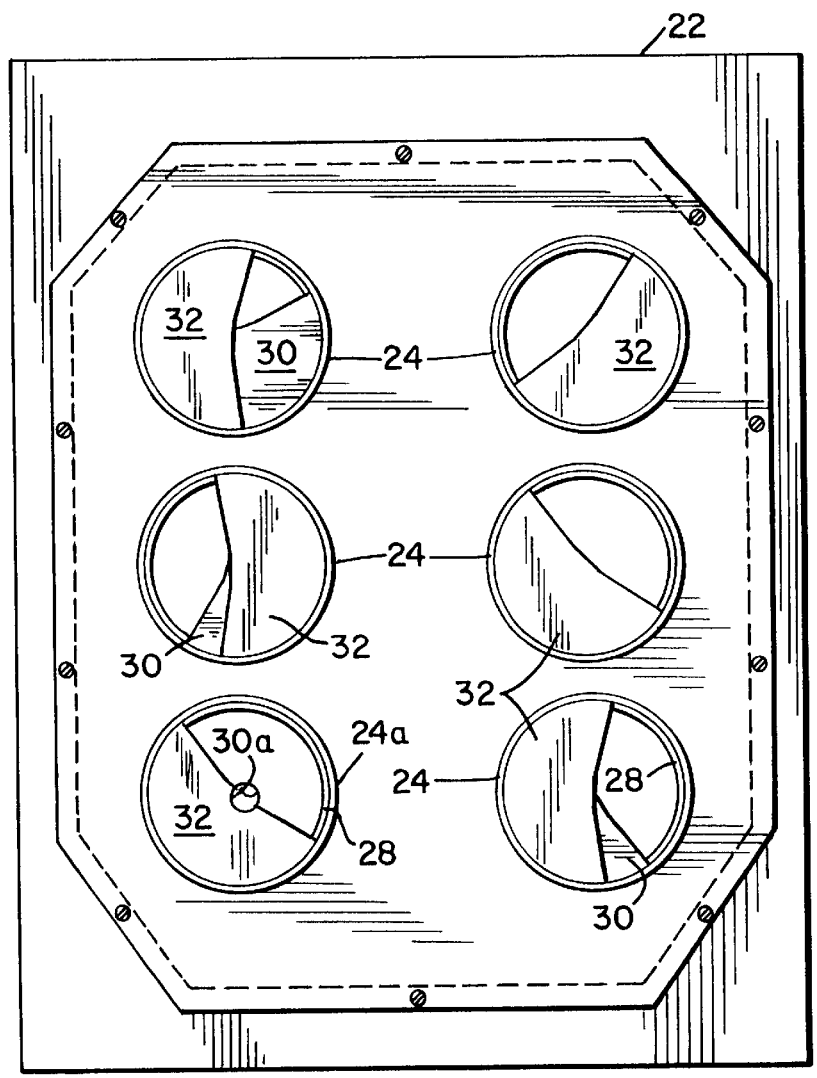
FIG. 5 illustrates the bottom panel of the cabinet with the grommets for controlling cold air flow into the cabinets, allowing wire to be pulled into the cabinet and subsequently closed around the wire to prevent the loss of cooling.

Referring now to FIGS. 1 and 2 of the accompanying drawings, a cabinet 2 has a highly perforated front door 4, side walls 6, only one of which is illustrated, and a back wall also not illustrated, a top wall 8, and a bottom wall 22 illustrated in FIG. 5. It is to be noted that the back panel and in a stand alone environment the side panels may also be highly perforated.

Figure 4A:
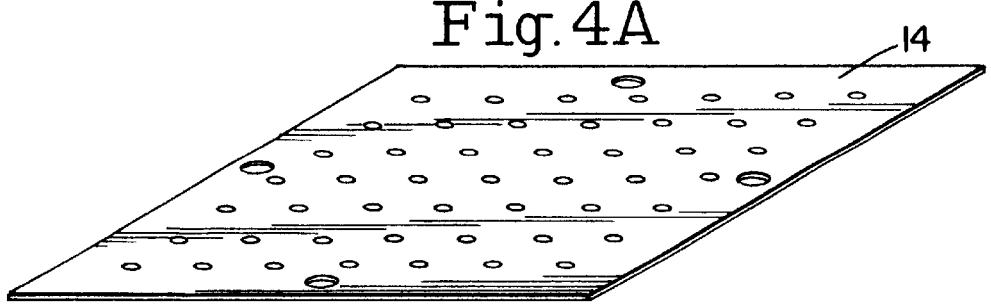
FIGS. 4A–4D illustrates various configurations of panels that may be employed with the top surface of the cabinet illustrated in FIG. 3.
Figure 4B:
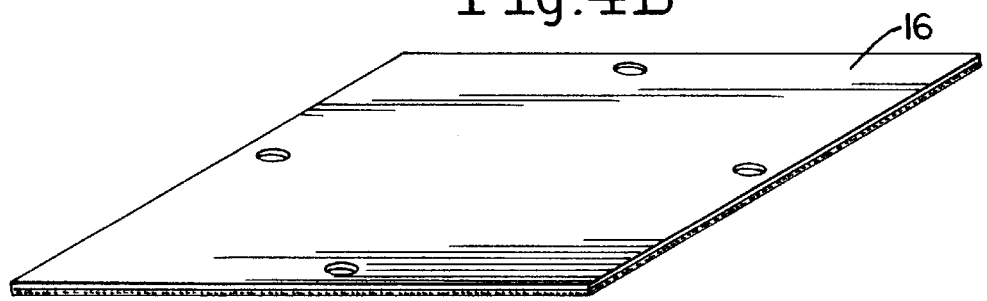
Figure 4C:
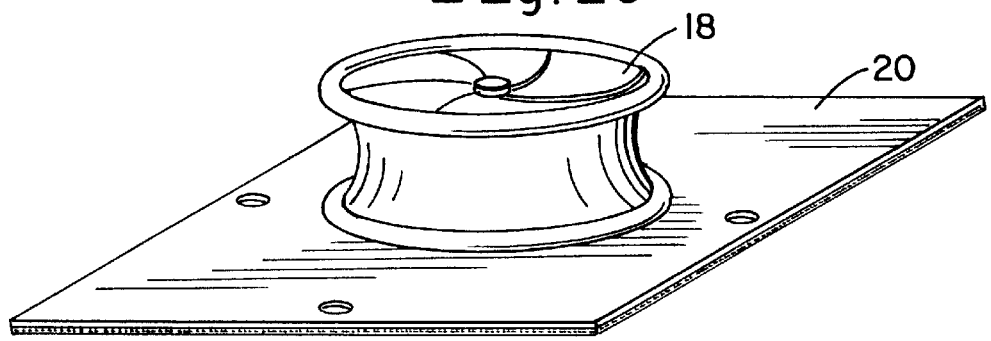
Figure 4D:
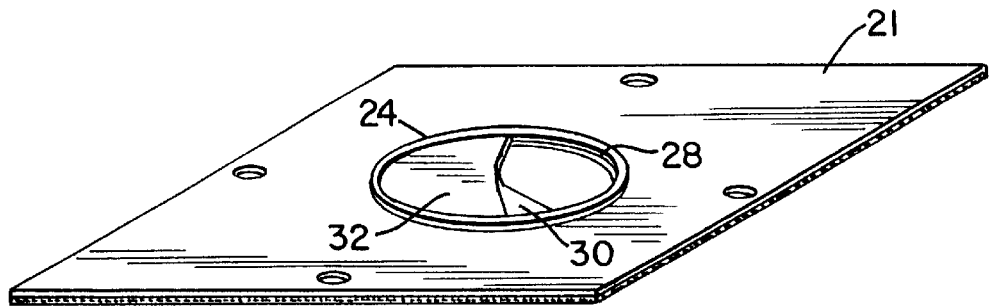

The top wall 8 has at least one or a number of openings 12 to receive panels that may be highly perforated; panel 14 FIG. 4A, solid panel 16, FIG. 4B or have a fan bearing panels 20 having a fan 18 mounted therein, FIG. 4C. FIG. 4D a top view of a variable opening panel grommet in the top wall to receive wires, if necessary.

Figure 3:
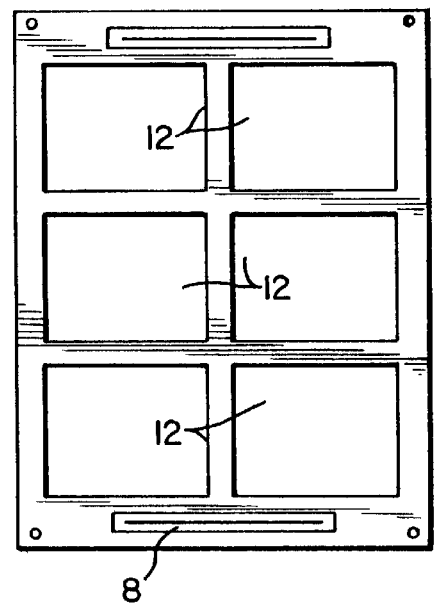
FIG. 3 illustrated the top surface of a cabinet providing for up to six spaces for blank panels or panels having fans mounted thereon or simply highly perforated panels.

The structure of top wall 8 is illustrated in greater detail in FIG. 3, each opening 12 being approximately 8 ½" deep×11 ⅛" wide in one embodiment of the invention. The highly perforated panel 14 is employed when a fan or fans are not used, panel 16 is used when a fan (or fans) is operating in one of the other openings and panel 20 is used to provide induced air flow through the cabinet.

The bottom wall of the cabinet is illustrated in FIG. 5 and is designated by reference numeral 22. The wall is illustrated as having six openings with a grommet 24 situated in each. Each grommet is adjustable to provide no opening, half opening with two blades, quarter opening with four blades, etc., in which it is situated. The grommet may be removed to provide full opening. Cables and wires may be brought into the cabinet through one of the grommets, grommet 24a in FIG. 5. Two plates 30 and 32, see FIG. 6 of the grommet 24a, one or both of which are notched at 30a, so that the wires and cables all fit in the hole thus provided and the grommet may be fully closed to prevent excessive flow of cool air out from under the floor.

Figure 6:
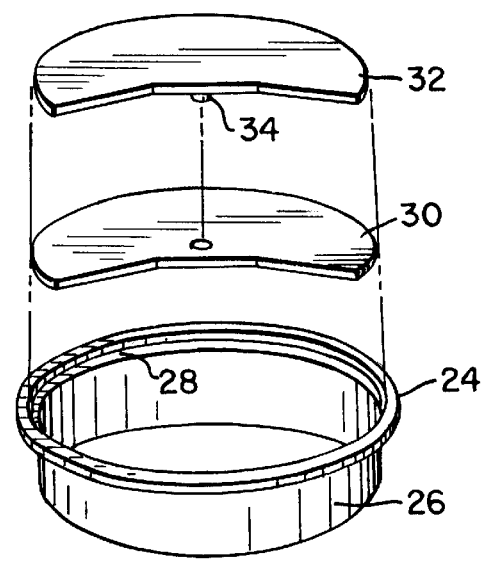
FIG. 6 is a detailed view of one of the grommets.

This same arrangement may be used for cables and wires brought in from the top. See FIG. 19. Referring to FIG. 6, the grommet consists of an outer shell 26 that fits in a hole in the bottom of the cabinet. The shelf 26 has a shoulder 28 on which two disc shaped members 30 and 32 may be seated. The members rotate about a small pivot pin 34 that joins the two members. By rotating the members relative to one another the size of the opening may be controlled. Wiring for the components to be situated in the cabinet may be brought in through the opening provided by openings left in the access floor system that the cabinet is installed over as seen in FIG. 10. The grommets may be closed sufficiently to block all air except for leakage past the cables, and as indicated in FIG. 5, even that can be restricted to virtually nothing by conforming the blades to fit snugly about the wires and cables.

Figure 7:
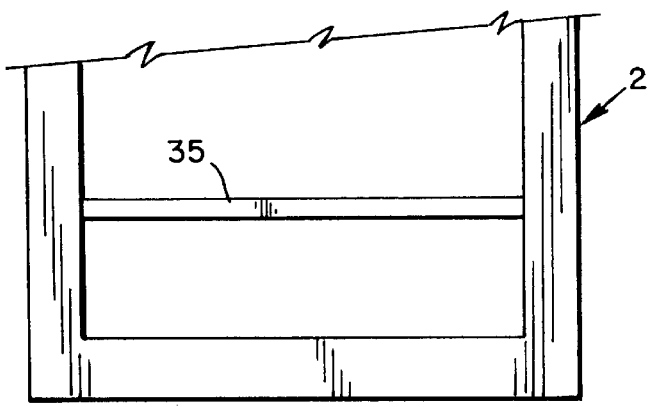
FIG. 7 illustrates the placement of the bottom shelf of the cabinet placed to permit access to the grommets.

Referring to FIG. 7, the cabinet 2 is illustrated as having a shelf 35 installed at the factory to prevent reduction of flow from below the floor by preventing any equipment being placed in that area at the same time the shelf provides uninhibited access to the grommets to permit adjustment as required. The gauge of the metal plate is such that a field cut slot such as slot 35 or 30*a* illustrated in FIG. 5 may be created for slipping the plate around existing wires, without disconnecting equipment. Referring to FIG. 7A, the shelf 35 is illustrated as having a slot for receiving cables and wires such as wires and cables 39.

The number of grommets and openings provided for panels in the top of the cabinet may be chosen to suit the needs of the system in which the apparatus is to operate. If the heat load is low, the grommets in the bottom of the cabinet may be closed and all of the top panel openings left open. Convection currents will bring air in through the front door to produce effective cooling. If the heat load is at a maximum, six fans may be used and the grommets in the bottom of the cabinet may be opened to the maximum extent. In this case one or more blank panels 36, see FIG. 2, may be inserted behind the perforated door 4 to further to control air flow through the door. As indicated hereinbelow, in some embodiments of the invention air flow through the door is essential for proper operation and the blank panels are removed to permit maximum flow through the door.

Figure 8:
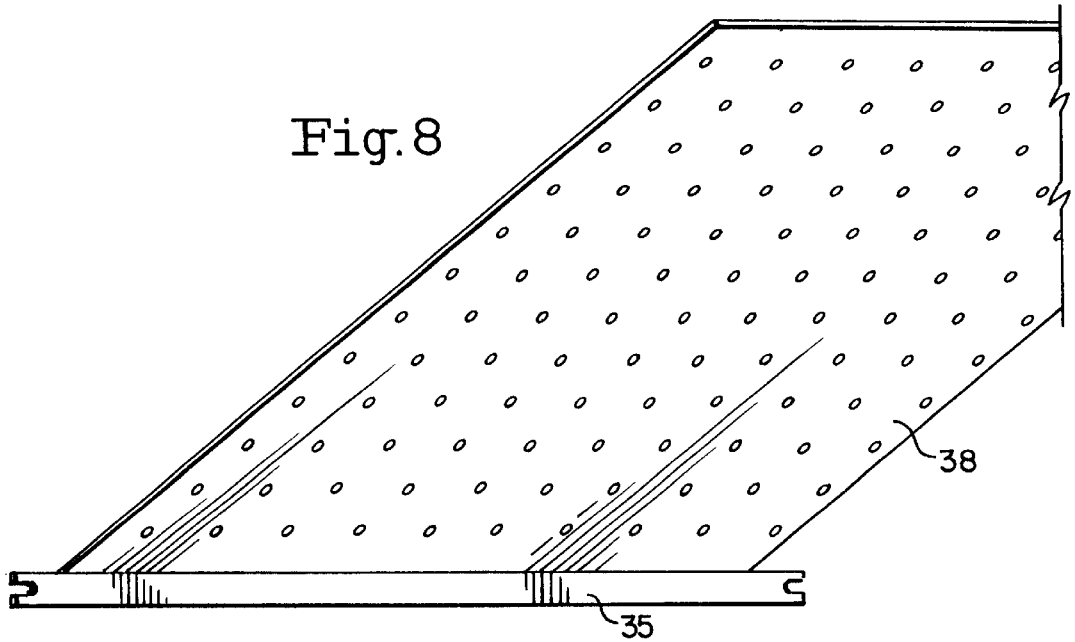
FIG. 8 is an isometric view of a perforated shelf employed in the present invention.

Referring to FIG. 8, as previously indicated, the shelves designated by the reference numeral 38 are perforated so that cooling air may flow freely about all surfaces of equipment resting on a shelf. As a typical example, the shelves may have as many as 75 perforations per square foot providing a 50% free area.

Figure 9:
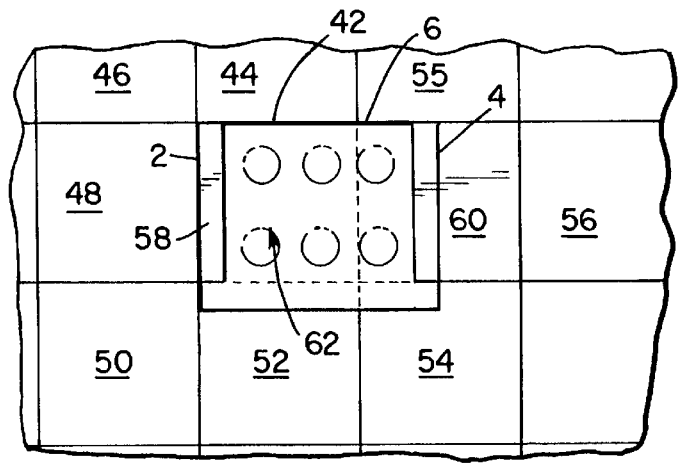

Referring to FIG. 9 of the drawings, the cabinets are situated on the tiles in groups, side by side; with the sides of the cabinets in contact with one another, thus isolating each cabinet from each other cabinet and rendering control of air conditioning within a cabinet wholly under control of the controls for a cabinet. On the other hand, if desired, controls in adjacent cabinets may be interrelated by passage of wires between cabinets through the side walls. In some installations, the groups of cabinets can run 20 to 30 cabinets, all depending on the geometry of the room and other physical conditions. As becomes apparent subsequently, groups of six cabinets are preferred. Wires may be passed through the side walls from one cabinet to the other via holes 40 (see FIG. 1). A break between cabinets, about every 6 cabinets is to permit service personnel access to the cabinets and to minimize problems with locating cabinets and cutting tiles. The cabinets are located on the floor to allow the floor tile adjacent to the back of the cabinet to be lifted to permit access to the area under the tile and cabinet.

In a typical embodiment the cabinets are 36" by 28" on the floor, and each floor tile is 24" by 24". It is apparent that each cabinet is supported by several tiles. With these dimensions a group of six cabinets occupy exactly 7 tiles and as becomes apparent below no cutting of the tiles on the job is necessary. Referring again specifically to FIG. 9 of the accompanying drawings, there is illustrated the positioning of one cabinet on the tiles of the elevated floor;

The door 4 of the cabinet is to the right as viewed in FIG. 9, while the right side 6 of the cabinet sits approximately along the edge of 42 of the tiles labelled 44 and 55. As can be seen and discussed relative to FIG. 10, the right side of the cabinet is supported over a beam 62. The back wall of the cabinet 2 sits on a beam under tiles 46, 48 and 50. The cabinet sits on tiles 54 and 57. An important feature is that no cutting of tiles at the installation site is required since the factory supplied tiles 58 and 60 accommodate a cabinet to the floor and permit support to be provided by the floor support pedestals.

As can be seen in FIG. 9, the cabinet is supported on tiles 42, 52, 54 and tile 56 and partial factory supplied, tiles 58 and 60, for a total of two full tiles and two partial tiles. Previous installation practices require custom cutting of expensive floor tiles to provide an opening through the tiles into the region below the elevated floor. The present invention allows the floor tile manufacturer to precut 4" tile 58 and 16" by 24" panel 60 at the back and front of the cabinet. The structure discussed leaves a center opening 62 for access to the cold region below the tile. The horizontal depth of the opening, as viewed in FIG. 9, is 28" so that the access is 24"×28"=672 sq. inches or 4.67 sq. feet.

The fact that the plenum plate has the grommets for wiring and cooling allows installers to avoid custom cutting of holes in expensive floor tiles. According to the present invention, the floor is installed and the cabinet is simply set on top of open tile areas. A small amount of sealant is applied to the bottom of the cabinet and the cabinets are slid into place. Time and money that is required for design, floor installation and floor tile custom cut openings below the cabinets is reduced dramatically. Flexibility for moving cabinets in the future is maintained.

FIG. 9A illustrates a conventional prior art approach to supporting a group of cabinets of the same size as those of the present invention. Each cabinet is supported over two or more tiles. Tiles must be cut to properly support and position the cabinet over an opening. In FIG. 9A, the elements 51 along the left side of the Figure to elements 53 along the right side illustrates the remainder of the tiles after cutting to accommodate the cabinet.

FIG. 9B illustrates an arrangement of tiles according to the present invention employing 8 tiles for support of 4 cabinets. The members 58 along the left side of the drawing are employed as illustrated in FIG. 9 and tiles 60 arrayed along the right side of the drawing are also as illustrated in FIG. 9. As can be seen in FIG. 9B custom cuts are required for support of a fourth cabinet of a group of 4. Tiles 61 and 63 have to be custom cut on the site.

If 6 cabinets are arrayed in a group, the width of the 6 cabinet array is 6×28=168". Each tile is 24" so 6 cabinets exactly equals 7 tiles. Thus, with the cabinets arrayed in groups of 6 no tile cutting is required on the job.

Figure 11:
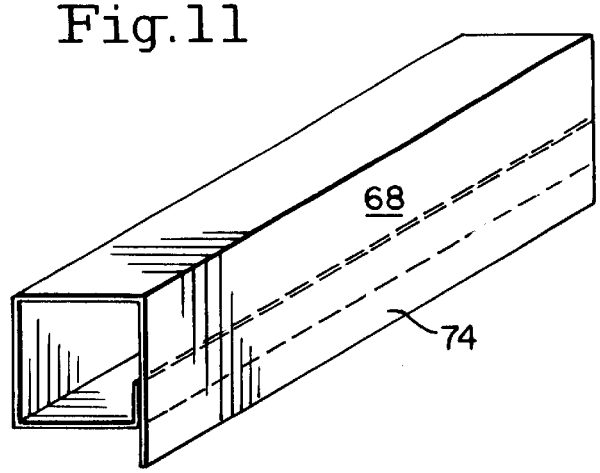
FIG. 11 illustrates a tile stop employed with the structure of FIG. 9.
Figure 12:
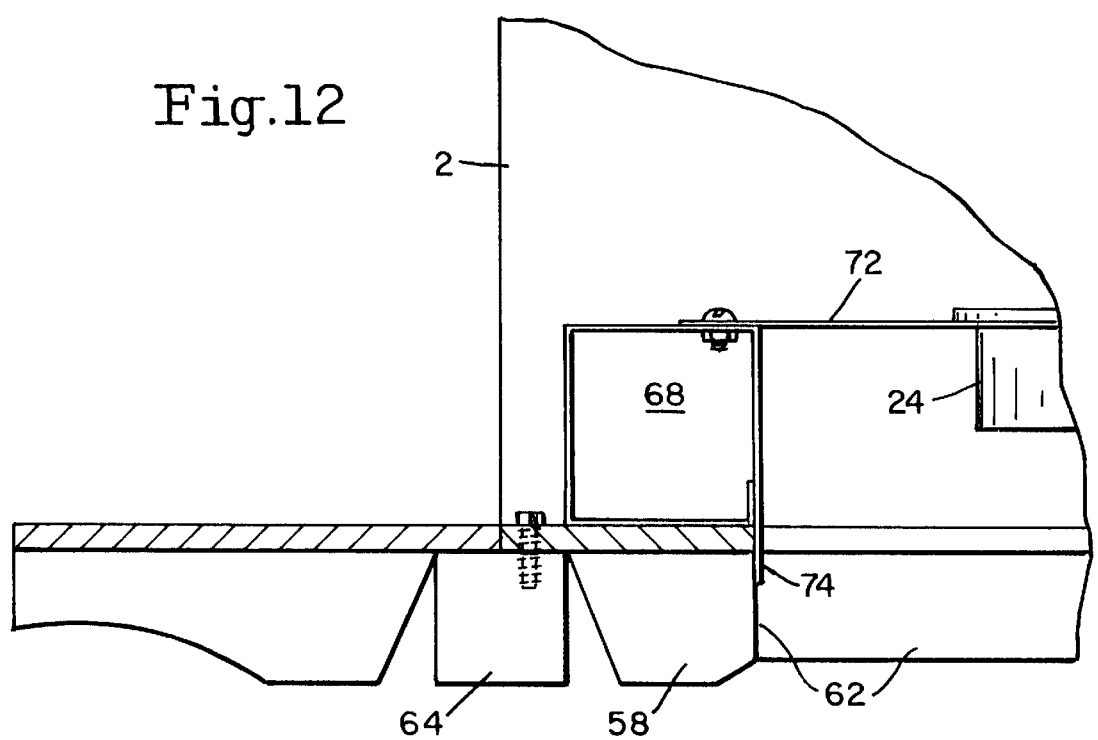
FIG. 12 provides a detailed view of the use of the tile stop in conjunction with a factory supplied pre-cut tile.

Referring now to FIG. 10 of the accompanying drawings the edges of the tiles in a standard elevated floor are supported on beams, reference numerals 64 and 66 (also known as "stringers") which beams are supported on pedestals 65. In the present invention the factory supplied partial tiles 58 and 60 are supported by beams 64 and 71 as illustrated in FIG. 10. To prevent the slabs 58 and 60 from sliding into the open space 62, tile stops 68 and 70 (see FIGS. 11 and 12) are employed. Referring to tile stop 68, it is secured under and to the grommet board 72 of the cabinet. The cabinet is secured to the beam 64 with bolts or clamps via the bottom of a wall of the cabinet as viewed in FIG. 12. The tile stop has a downward extension 74 that is seated, as viewed in FIGS. 10 and 12, along the edge of the slab 58. The cabinet is secured to the beam 64, the tile stop is secured to the grommet board 72 and the extension 74 prevents movement of the slab 58. Thus, the entire structure is integrated to insure that all elements of the structure remain in fixed position relative to one another. In this regard the group of cabinets, nine for instance, are all tied into the beams 64 and 66, and cannot move relative to one another.

Referring now to FIG. 13, bars 75 are suspended from the top of the cabinet frame to prevent materials from being placed close enough to the top wall of the cabinet to impede flow of air through the top wall. Thus, steps are taken to insure unimpeded flow of air into and out of the cabinet.

Referring now to FIG. 14, there is schematically illustrated the entry of wires and cables into a cabinet and the passage of such wires and cables into the adjacent cabinet. Specifically, a cabinet 76 receives cables and wires 77 from under tile floor 78 through one of the grommets. See FIG. 5 for details. The wires and cables are connected to various pieces of equipment 80 and 82 and fans 81, and wires and cables 86 are taken from the equipment and incoming wires and cables into an adjacent cabinet 84. The cable openings 40 can be sealed tight about the wires and cables to prevent air flow from cabinet to cabinet.

As an example of one configuration, the solid wall panels between the cabinets have six two inch holes that are used to convey wire between adjacent cabinets without serious affecting cooling performance between a lightly loaded and heavily loaded equipment cabinet. Seating, if necessary, can be provided.

Referring now to FIG. 15 of the accompanying drawings, the apparatus of FIG. 1 is modified by replacing at least one of the panels 12 with a grommet bearing panel 32. If desirable, wires and cables 88 may be brought in from a cable tray or conduit 89 through such a grommet. The grommet in such case is of the configuration of grommet 24a illustrated in FIG. 5; that is, the plates of the grommet are notched to seal about the wires and cables 88. The grommet also provides control of air flow in and/or out through the top and multiple grommets may be used for this purpose. A gasketed slot can be used for wires instead of a grommet.

The arrangement of FIG. 15 illustrates three side-by-side cabinets 144, 146 and 148. Wires 88 as appropriate are passed from cabinet 144 through apertures 40 of the contacting side walls of the cabinets to the other cabinets 146 and 148 and others down the line if appropriate.

FIG. 15A provides a somewhat modified view of the top of the cabinets 144, 146 and 148. Cables and wires 150 are brought down from a cable tray 149 rather than a conduit as in FIG. 15, thus providing less complexity to these items. The wires and cables 150 extend into cabinet 146 through a grommet or gasketed slot 152 in the center cabinet 146 so that wires may extend in either or both directions into cabinets 144 and 148.

Figure 16:
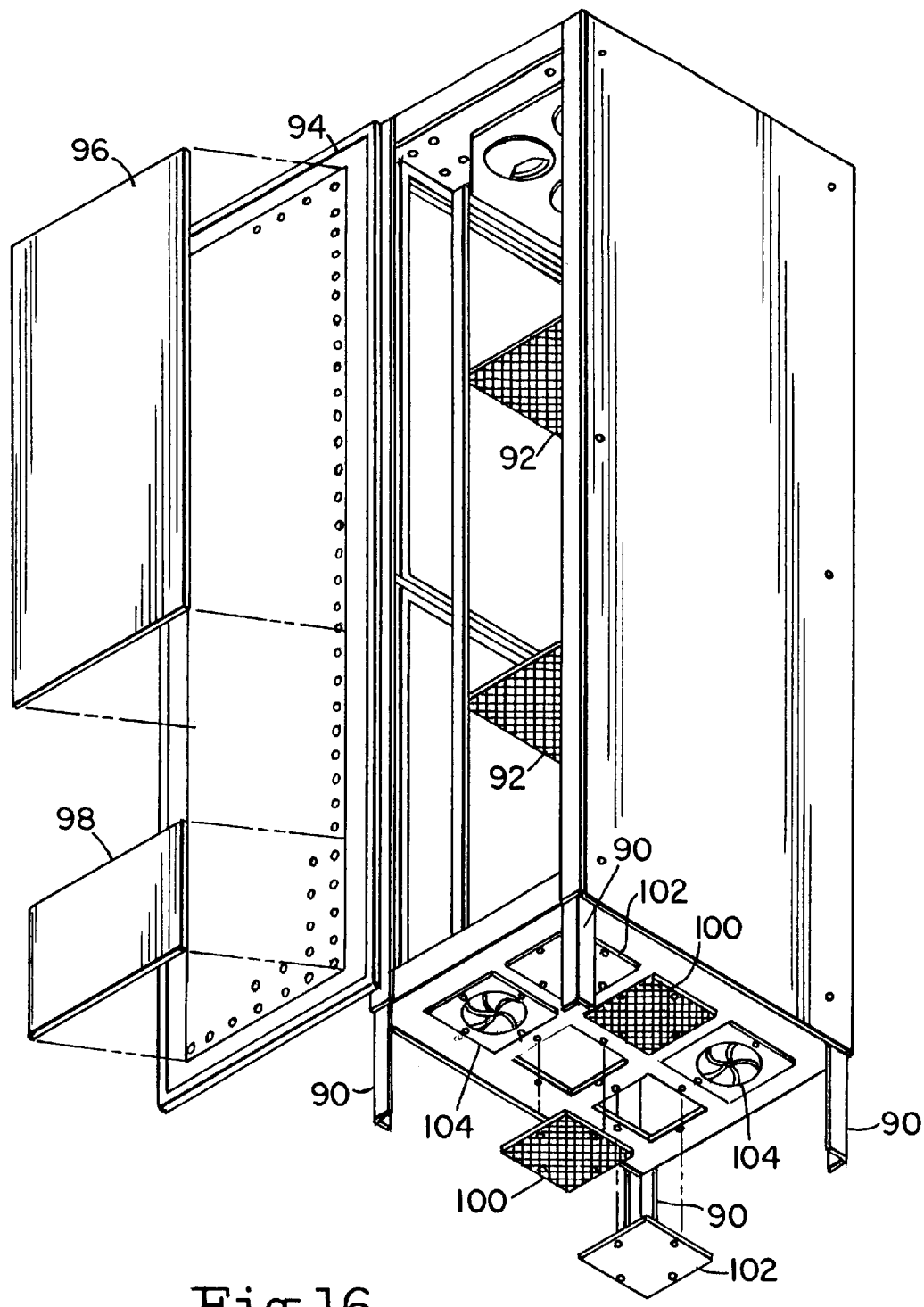
FIG. 16 illustrates the structure when employed in a situation in which cooling air is not supplied under the floor.

Referring now to FIG. 16, there is illustrated a modification of the structure to permit use with a solid floor and an air conditioned room.

The cabinet is used to induct ambient air that is supplementally cooled by a room air conditioning system through the perforated front, side, bottom or back panels and drawn up through the computer equipment by the top mounted induction fans. The basic structure of FIG. 1 can be stood on legs, directly on the floor, or the induction fans can be mounted in the bottom plate blowing up, if required by a particular installation. Such an arrangement is employed to take advantage of the maximum volume of cold air in the lower regions of the room. The legs are of a length to provide unimpeded flow of air in through the bottom wall; a foot to a foot and a half long legs are adequate.

The cabinet again has perforated shelves 92, a front door 94 and door inserts 96 to provide control of flow through a the highly perforated region of the door. The panel may be solid or perforated to varying degrees. Again, inserts at the bottom wall; such as, porous, solid or fan accommodating panels 100, 102 and 104, respectively may be provided.

Thus, the cabinet of FIG. 16 is essentially the same as the device of FIG. 1, but with legs.

As discussed in the introduction and above, in order to conserve cool air under the floor so as not to exceed the capacity of the air conditioner supplying the cool air under the floor, the system may be somewhat modified. In this arrangement reliance is placed on room air to produce the cooling; either normal room air or air conditioner cooling room air.

In one embodiment, no fans are used. Convection flow in the cabinet inducts sufficient room air to control temperature in the cabinet. In this instance a cabinet door such as illustrated in FIG. 17 may be employed. The door 108 to a cabinet 110 includes a panel 112 having a highly perforated central region 114 to solid top and bottom regions 116 and 118. A solid slide 120 in its uppermost position covers the perforated region of panel 112 and blocks air flow through the door. The panel 120 is illustrated in its lowermost position and exposes the perforations in the panel 112. The panel may be positioned to expose perforations 114 to varying degrees and thus control flow through the door. The panels and slide are retained by a further panel 122 that engages the edges of the panels.

The various panels are fabricated from clear plastic so that the interior of the cabinets are clearly visible.

Referring now to FIG. 18, there is illustrated the front of a cabinet showing the details of the slide 120 and its associated structure. The reference numerals of FIG. 17 are used in this Figure. The slide 120 is illustrated as partially depressed to expose the perforations 114 in panel 112. The panel 122 retains all elements in place.

Note at the top of the cabinet above the door 108, an opening 126 behind which is a temperature indicator 128 for the interior of the cabinet 110, together with a warming light 130. The light 130 sticks out of the cabinet, see FIG. 17, so that it may be observed from a wide range of positions in the room. If overheating occurs that light 130 will light up to indicate the overhead condition.

Referring to FIG. 18A, the details of a unit 132 suitable for use in the cabinet is illustrated. The unit 132 includes a temperature sensing element, a thermistor, not illustrated. The unit 132 also provides a visual display 132 (liquid crystal) and is available from Weiss Instruments, Farmingdale, N.Y. Also, an audible alarm and an integrated circuit to provide monitoring over a local area network of the Internet may be provided.

Figure 19:
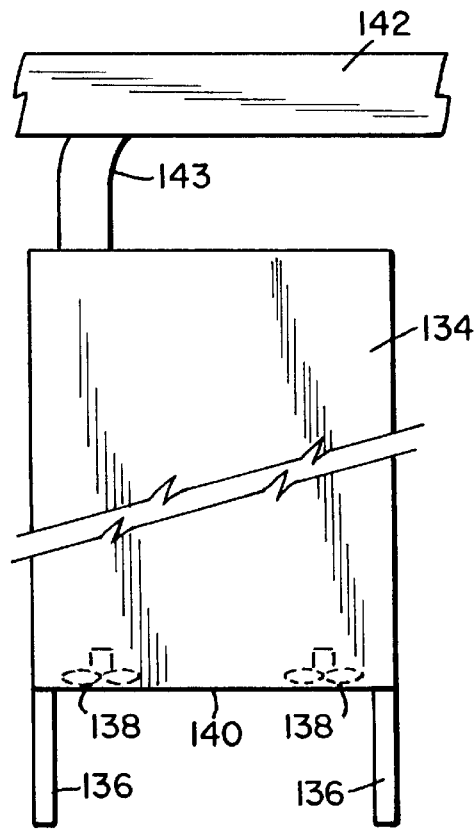
FIG. 19 illustrates the use of overhead ducting to provide cool air to, or exhaust hot air from, the cabinet.

Referring now to FIG. 19, an arrangement employing an overhead duct is provided. A cabinet(s) 134 stands on legs 136 and has fans 138 located in its bottom panel 140. The cabinet(s) is located under an overhead duct 142, which may be a cooling duct or an exhaust duct. If the duct is a cooling duct, the cool air is directed to the cabinet via a take-off duct 143. The fans 138 pulls the cool air down through the cabinet and cool the equipment therein.

If the duct 142 is part of an exhaust system, then the fans can produce upward flow to blow cool air up through the cabinet to cool as stated relative to FIG. 16 and the heated air traverses duct 143 to exhaust duct 142.

It should be noted that the system illustrated is the inventor's early production design and various modifications can be made in the equipment, and in particular the specific pieces of equipment specified herein.

Once given the above disclosure, many other features, modifications and improvements will become apparent to the skilled artisan. Such features modifications and improvements are, therefore, considered to be a part of this invention, the scope of which is to be determined by the claims.

What is claimed is:

1. A structure for cooling a cabinet containing heat producing elements, comprising
    an enclosure having an interior with at least a top wall, a bottom wall and least one shelf located in a fixed position,
    a front and rear door being highly perforated to permit cooling gas to flow therethrough,
    said bottom wall having at least one variable size opening therein,
    said one shelf positioned to prevent equipment from being located sufficiently close to said bottom wall to hinder flow of cooling gas through said variable size opening and to permit ready access to said variable size opening to adjust a size of said opening,
    said top wall having at least one opening therein,
        a plurality of panels selectively insertable into said at least one opening in the top wall,
        at least one of said panels adapted to control flow of air through said opening,
        means for selectively providing access to cool air located under said bottom wall of said enclosure, said enclosure having a highly perforated door, and means for controlling the flow of air through said doors.

2. An arrangement for controlling the temperature in each of an array of cabinets comprising,
    a plurality of cabinets, each having side walls to isolate each cabinet from each other cabinet, top walls, a bottom wall, a back wall and a perforated front door;
    an elevated floor of tiles having cooling air thereunder under pressure;
    said cabinets arrayed on said tiles in groups of a predetermined number having their side walls substantially in contact;
    means for introducing communication and power wires into at least one of said cabinets;
    means for passing wire and cables from one cabinet to one or more adjacent cabinets through said walls;
    means for maintaining a low level of leakage of air around said wires and cables;
    means for regulating introduction of cooling air into said cabinets through said bottom walls.

3. The arrangement of claim 2, wherein said cabinets have a predetermined width;
    said floor includes openings therethrough, to permit access to cool air under said tiles; and
    a group of cabinets positioned on said tiles, the combined width of which equals the width of tiles providing a number of said openings equal to the number of said cabinets in said group.

4. The arrangement of claim 2, wherein said cables and wires enter the cabinet from under the tile floor.

5. The arrangement of claim 2, further comprising means for preventing leakage of gas flow around said cables and wires.

6. The arrangement of claim 2, wherein each of said cabinets has at least one variable opening in its bottom wall.

7. The arrangement of claim 6, further comprising a grommet adapted to be received in said opening of said bottom wall, said grommet having a variable size opening in a range to almost fully open the opening in one position and substantially fully close the opening in another position and to provide openings in between throughout the range wherein said grommet is insertable into said opening to control the area of unimpeded air flow through said opening in said bottom wall.

8. The arrangement of claim 2, further comprising a bottom shelf secured in said cabinet a distance above said bottom wall to permit access to a grommet in said bottom wall from above said bottom wall to enable adjustment of said opening.

9. The arrangement of claim 2, further comprising horizontal bars disposed in said cabinet under the top wall at a distance to prevent articles from being placed close enough to the top wall to impede flow of gas therethrough.

10. The arrangement of claim 9, further comprising a first duct positioned above said cabinets, and further ducting adapted to extend from said first duct to said cabinet to control air flow in said cabinet.

11. The arrangement of claim 10, wherein said first duct is adapted to carry cooling air, and said fan is adapted to pull air through said cabinet.

12. The arrangement of claim 10, wherein said first duct is adapted to carry exhaust air; and a plurality of fans are adapted to pull air upward through said cabinets.

13. The arrangement of claim 3, wherein the relationship between cabinets and said tiles is AX=BY where X is the width of a single tile, A is the number of tiles, Y is the width of a single cabinet, and B is the number of cabinets, said cabinets are arrayed side-by-side in a group positioned on said tiles.

14. A structure for cooling an enclosure containing heat producing elements, comprising:
    a cabinet having sides walls, and top and bottom walls to effectively isolate said cabinet from other object and environments;
    a plurality of fans in said top wall;
    means for limiting power consumption by said fans to less than 10% of the power consumed by equipment located in said cabinet;
    at least two additional panels selectively insertable into at least one opening in said top wall;
    a first of said panels being highly perforated, a second of said panels to block flow of gas therethrough, and a third of said panels having an induction fan secured thereto to draw air through said opening.

15. The structure of claim 14, further comprising legs for supporting said cabinet above said tile floor, and means for drawing ambient cool air into said cabinet.

16. A structure for cooling a cabinet containing heat producing elements, comprising
    an enclosure having an interior with at least a top wall, a bottom wall and least one shelf located on a fixed position,
    said wall being highly perforated to permit cooling gas to flow therethrough,
    said bottom wall having at least one variable size opening therein,
    said one shelf positioned to prevent equipment from being located sufficiently close to said bottom wall to hinder flow of cooling gas through said variable size opening and to permit ready access to said variable size opening to adjust a size of said opening,
    said top wall having at least one opening therein,
    a plurality of panels selectively insertable into said at least one opening in the top wall,
    at least one of said panels to control flow of air through said opening, a tile floor on which said cabinet is supported, legs adapted to support said cabinet above the tile floor, and means for inducting cool ambient air into said cabinets, said enclosure having a highly perforated door, and means for controlling the flow of air through said door.

17. The structure of claim 16, wherein said inducting means includes introducing air through said door.

18. The structure of claim 16, wherein said inducting means includes introducing air through said bottom wall.

19. A method of cooling an interior of a cabinet having a top wall with openings, a perforated door, perforated shelves, side walls and a bottom wall with openings, comprising:

locating the cabinet over an opening in tiles of a raised floor having a source of cool air under the tiles;

controlling the size of the opening in the bottom wall to control the flow of cool air into the cabinet;

selectively controlling the flow of ambient air into the cabinet through the door, and controlling air flowing through the top wall, inserting panels into the top wall for selectively affecting air flow in said cabinet, selected from the group of increasing the flow of air through the top wall, decreasing the flow of air through the top wall, and allowing normal convection currents produced by the heat of materials in the cabinet to provide flow of air through the top wall, or combinations thereof.

20. The method of claim 19, further comprising increasing flow of air through the cabinet by inserting a panel having an induction fan mounted thereon in an opening in the top wall.

21. The method of claim 19, further comprising employing pieces of tiles on which the cabinet is positioned to provide an opening into the cabinet through the tiles to the cool air.

22. The method of claim 21, further comprising retaining the pieces of the tile in their proper positions.

23. The method of claim 19, further comprising securing the cabinet to the tile floor to maintain said cabinet position on the floor.

24. The method of claim 19, further comprising securing the cabinet to a beam supporting the tiles, and securing a member for retaining the tiles in position under the bottom wall of the cabinet.

25. The method of claim 19, further comprising controlling the flow of ambient and cool air through the cabinet to maintain an interior temperature within acceptable limits.

26. The method of claim 19, further comprising passing power and communication cables from under the tiles into at least one of the cabinets through the opening in the bottom wall of at least one of the cabinets while reducing flow of air between cabinets.

27. The method of claim 19, further comprising adding additional cabinets side by side on the tile floor such that the cabinets may essentially touch one another along their sides, and passing wires through the side walls to provide energy and communication facilities to each cabinet.

* * * * *